(12) United States Patent
Van Der Schaft et al.

(10) Patent No.: US 6,838,820 B2
(45) Date of Patent: Jan. 4, 2005

(54) ELECTROLUMINESCENT DEVICE

(75) Inventors: Lucien Maria Johan Van Der Schaft, Heerlen (NL); Herbert Lifka, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/136,989

(22) Filed: May 1, 2002

(65) Prior Publication Data

US 2003/0219529 A9 Nov. 27, 2003

(51) Int. Cl.$^7$ .......................... H05B 33/00; H05B 33/02
(52) U.S. Cl. ................ 313/506; 313/504; 313/509
(58) Field of Search ......................... 313/498, 504, 313/506, 509

(56) References Cited

U.S. PATENT DOCUMENTS 6,037,712 A    3/2000   Codama et al. ............. 313/498

6,232,713 B1 * 5/2001 Hamada ..................... 313/498

FOREIGN PATENT DOCUMENTS

| EP | 0892588 | 1/1999 | .......... H05B/33/22 |
| WO | WO9921936 | 5/1999 | .......... C09K/11/06 |

OTHER PUBLICATIONS

"Organic electroluminescent device and a method of manufacturing thereof", U.S. Ser. No. 10/008087; Filed, Nov. 8, 2001.

* cited by examiner

*Primary Examiner*—Nimeshkumar D. Patel
*Assistant Examiner*—Mariceli Santiago

(57) ABSTRACT

An electroluminescent device (51) comprises a partitioning relief pattern having overhanging sections (13) for partitioning an electrode layer of the electroluminescent device (51) into a plurality of independently addressable electrode segments (11a, 11b, 11d). The overhanging section (13) is bent at predetermined positions (13b, 13c, 13d, 13e). The bends thus formed are rounded and/or beveled in order to reduce the risk that electrode segments (11a, 11b, 11d) are inadvertently connected via a second electrode layer segment present on top of the overhanging section (13).

11 Claims, 3 Drawing Sheets

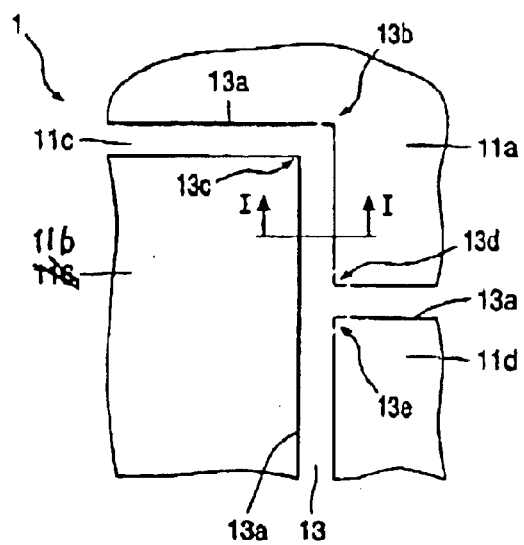
FIG. 1 [PRIOR ART]
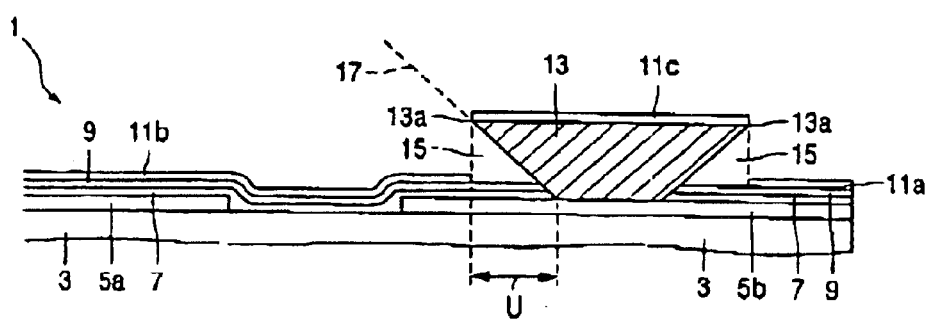
FIG. 2 [PRIOR ART]
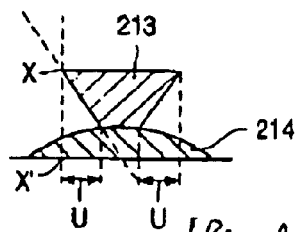
FIG. 2A [PRIOR ART]
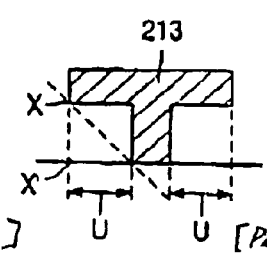
FIG. 2B [PRIOR ART]
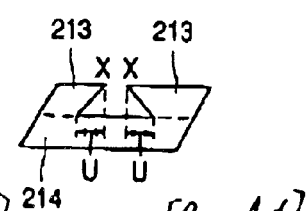
FIG. 2C [PRIOR ART]

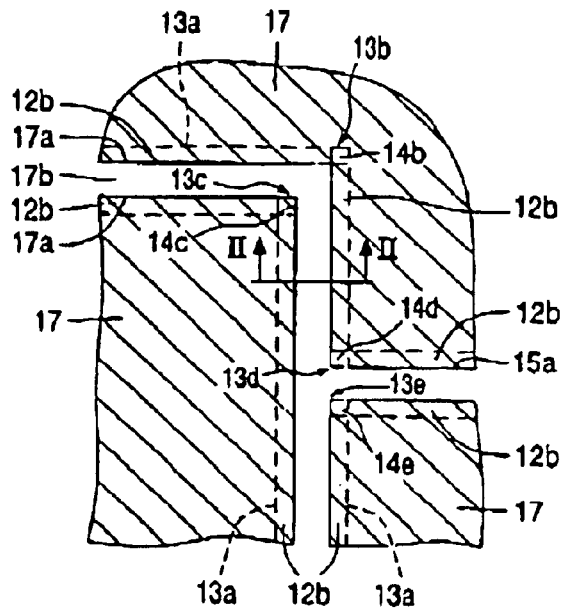
FIG. 3 [Prior Art]
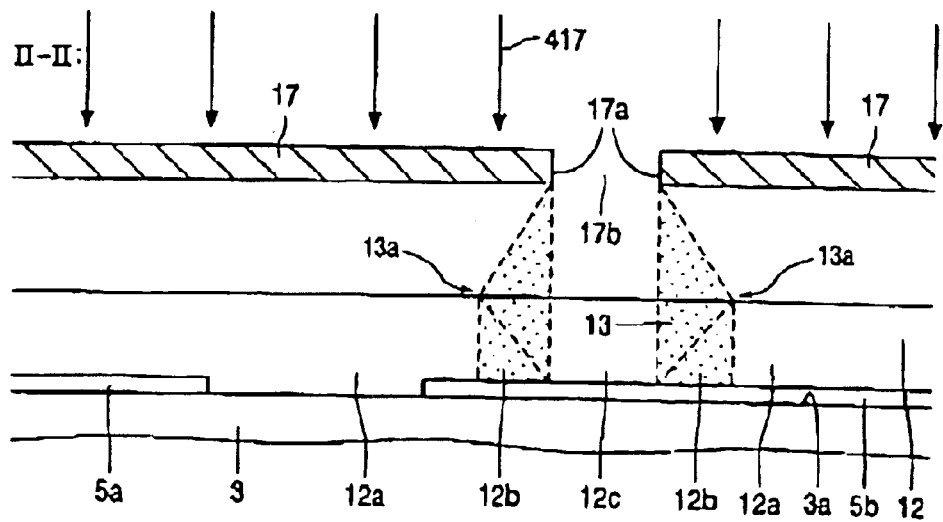
FIG. 4 [Prior Art]

ELECTROLUMINESCENT DEVICE

The invention relates to an electroluminescent device comprising a substrate surface provided with a relief pattern comprising an overhanging section which is undercut for patterning an electrode layer of the electroluminescent device, the overhanging section having an outer boundary comprising at least a substantially straight segment and a bend at a predetermined position.

Generally, an electroluminescent (EL) device is a device comprising EL material capable of emitting light when a current is passed through it, the current being supplied by means of electrodes. If the EL material or any other functional material, if present, disposed between the electrodes or electrode layers is of organic or polymeric nature the device is referred to as an organic or polymer(ic) EL device respectively. In the context of the invention, the term organic includes polymeric.

EL devices of the diode type, light-emitting diodes, preferentially pass current in one direction and generally comprise EL material disposed between a hole-injecting electrode (also referred to as the anode), an electron-injecting electrode (also referred to as the cathode). Upon application of a suitable voltage, holes and electrons are injected into the EL material by the anode and cathode respectively. Light is produced by radiative recombination of holes and electrons inside the EL material. Using different organic EL materials, the color of the light emitted can be varied.

EL devices can be used as light sources and, in particular those of the organic type, are suitable for large area lighting applications such as a back light for a display. (Organic) EL devices comprising a plurality of electroluminescent elements (hereinafter also referred to as pixels) are suitable for display purposes such as a monochrome or multi-color display device, a still image display, a segmented display device, or a matrix display of the passive or active type. Organic and in particular polymer EL devices can be made flexible or curved and shaped allowing display applications not realizable with rigid and/or flat displays.

In EP-A-892588 an electroluminescent device is disclosed in the form of a segmented EL display device. In order to pattern the electron-injecting electrode layer into independently addressable segments, a partitioning relief pattern having an overhanging section is provided on a substrate. The overhanging section is T-shaped thus providing an undercut region. When the electrode layer is deposited using vacuum deposition involving a flux of electrode material directed at right angles to the substrate, electrode material is not able to reach the undercut region thus the electrode layer is partitioned in distinct segments. The overhanging section has an outer boundary which outlines the outer boundary of the undercut region and accordingly the outline of the electrode segments. In order to accommodate a desired predetermined pattern of the electrode layer, the outer boundary has substantially straight segments and is bent at predetermined positions.

In practice a balance has to be found in the extent of undercut. A too large undercut region may adversely affect the deposition of subsequent layers of the EL device and increases the risk that at a given width at the top the overhanging section falls over, whereas a too small undercut makes the electrode separation unreliable. In any case, the process window for successful patterning an electrode layer of the type described hereinabove is rather small. Due to variations in the electrode layer deposition process or in the process of providing the partitioning relief pattern, such variations being inherent in any process, electrode separation may not be successfully achieved at every position leading to electrode segments which are inadvertently electrically connected. Devices having such circuited electrodes are defective and reduce the yield of the manufacturing process.

An object of the invention is to provide, inter alia, an electroluminescent device of the type described in the opening paragraph which allows the electrode layer to be manufactured in a robust reliable manner and in a high yield. In particular, the improved reliability, robustness and yield is to be realized if the partitioning relief pattern is made of photo-patterned or photo-patternable material such as photoresist. More in particular, the improved yield should also be attainable if functional layers of the EL device, such as the EL layer, are deposited by means of wet deposition methods.

In accordance with the invention this object is achieved with an electroluminescent device as mentioned in the opening paragraph which is characterized in that the bend is sufficiently smooth to render the overhanging section at a bend undercut to substantially the same extent as at the straight segment of the overhanging section.

The inventors have observed that inadvertent short-circuits between electrode segments predominantly occur at positions where the overhanging sections are, or more precisely the outer boundary of the overhanging section is, bent. By using a sufficiently smooth bend, positions along the smooth bend are sufficiently similar to positions along a straight segment thus reducing the risk of short-circuits at bend positions to the level encountered for straight line segments.

Obviously, if the outer boundary contains a plurality of bends which may contribute to the occurrence of a short-circuited electrode segments it is beneficial to make all such bends sufficiently smooth.

Obtaining substantially the same extent of undercut in bends and straight sections is of particular concern if functional layers of the EL device, such as the EL layer, are provided using a wet deposition method such as spin-coating or ink-jet printing because it has been observed that the fluid form which such layers are obtained creeps into the undercut regions 15 which leads to thick deposits (as much as 0.5 $\mu$m thick deposits have been found) in the undercut region thus reducing the extent of undercut even further.

Further elucidating the invention, the outer boundary of the overhanging section is understood to be a continuous curve which defines the outer boundary of the undercut region of the overhanging section and which accordingly defines the outline of the electrode pattern by vertically projecting the outer boundary onto the substrate surface. The surfaces of the overhanging section which connect the outer boundary to the surface supporting the relief pattern are the side walls of the overhanging section.

The outer boundary comprises a bend at a predetermined position. The term predetermined is understood to mean that the bend serves a particular purpose, or provides a particular technical effect in contrast to a bend which is created by some flaw (random or systematic) in the manufacturing process. A bend is said to be an inside bend, or a bent segment is said to be an inside bent segment, if every straight line segment connecting any two points on either side of the bend runs outside the overhanging section. Conversely, a bend is said to be an outside bend if any such straight line segment runs inside the overhanging section.

A particular form of overhanging section is a rib-shaped overhanging section. Such a rib-shaped overhanging section has a side-wall on each side. A simple bend in the rib-shaped section is a bend where the outer boundary has an inside and outside bend running more or less parallel to each other.

The bend is to be sufficiently smooth. The smoothness of a bend can be adjusted, for example, by making appropriate adjustments to the mask used to pattern the photo-patternable material from which the partitioning relief pattern is made.

The extent to which a bend needs to be smooth depends inter alia on the resolution limit of the illumination apparatus used to provide the partitioning relief pattern. Therefore, in its broadest sense, rather than providing specific smoothness values, it is appropriate to define the extent to which a bend needs to be smoothed in terms of the extent to which the overhanging section is undercut. Whether or not the bend is smooth to the required extent can be established by routine analysis techniques such as by taking scanning electron micrographs of cross-sections of the partitioning relief pattern at various positions along the boundary. If desirable, suitably designed test structures may be used this purpose.

In the context of the invention, the extent of undercut at a position X of the outer boundary is defined as the distance U between the point obtained by vertically projecting the point X on the surface supporting the overhanging section and the point of intersection of the surface supporting the overhanging section and the line which lies in the plane containing the transverse profile at X, which passes through X, and which touches, but not intersects, the side wall of the overhanging section at a position or positions different from X or, if the side wall is substantially straight at X, the line which is coincident with the straight side wall.

The transverse profile at a position X of the outer boundary is contained in the plane of cross-section comprising said position and having a normal corresponding to the vertical projection on the substrate surface of the tangent at position X of the outer boundary (or the tangent plane of the substrate surface if the latter is curved).

In accordance with the invention, the extent of undercut at a bend, $U_b$, is to be substantially the same as the extent of undercut at a straight segment, $U_s$. Those skilled in the art will appreciate that the relationship between the extent of undercut the risk of short-circuiting is a gradual one, and that any quantitative dividing line separating undercuts which are substantially the same from those with are different is to some extent arbitrary. Bearing this in mind, in the context of the invention, substantially the same is understood to mean that $U_b/U_s$ is larger than 0.80 or preferably larger than 0.90 or even better, larger than 0.95.

If a bend is not smooth there are at least two ways in which it can be made more smooth, viz. by beveling or rounding the bend or a combination thereof.

Selecting the smoothness of the bend based on the extent of undercut is a reliable criterion for assessing the risk of short-circuited electrode segments. However its application requires cross-sections to be taken at specific positions, in particular at positions where the bends are, which is can be cumbersome as it involves breaking the substrate at exactly those positions. It is therefore beneficial to have a criterion which is simpler to use.

Typically, an EL device comprises an EL layer disposed between a first and a second electrode layer, where the second electrode layer is assumed to be patterned by means of the partitioning relief pattern. Optionally, it may contain further layers such as hole or electron transporting/injecting layers. With respect to reducing the risk of inadvertent short-circuiting among segments of the second electrode layer, the choice of first electrode layer, EL layer and hole or electron transporting/injecting layer and materials for such layers is not critical.

Suitable organic EL materials include organic photo- or electroluminescent, fluorescent and phosphorescent compounds of low or high molecular weight. Suitable low molecular weight compounds are well known in the art and include tris-8-aluminium quinolinol complex and coumarins. Such compounds can be applied using vacuum-deposition method.

Preferred high molecular weight materials contain EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly(alkyl)fluorenes and poly-p-phenylenevinylenes which emit red, yellow or green light and are 2-, or 2,5-substituted poly-p-phenylenevinylenes.

In the context of the invention, the term organic includes polymeric whereas the term polymer and affixes derived therefrom, includes homopolymer, copolymer, terpolymer and higher homologues as well as oligomer.

The organic EL layer preferably has an average thickness of 50 nm to 200 nm, in particular, 60 nm to 150 nm or, preferably, 70 nm to 100 nm.

Suitable materials for the hole injecting/transporting layers (HTL) include aromatic tertiary amines, in particular diamines or higher homologues, polyvinylcarbazole, quinacridone, porphyrins, phthalocyanines, poly-aniline and poly-3,4-ethylenedioxythiophene.

Suitable materials for the electron injecting/transporting layers (ETL) are oxadiazole-based compounds and aluminiumquinoline compounds.

If ITO is used as the anode, the EL device preferably comprises a 50 to 300 nm thick layer of the hole injecting/transporting layer material poly-3,4-ethylenedioxythiophene or a 50 to 200 nm thick layer of polyaniline.

Generally, the EL device comprises a substrate. Preferably, the substrate is transparent with respect to the light to be emitted. Suitable substrate materials include transparent synthetic resin which may or may not be flexible, quartz, ceramics and glass. The substrate provides the supporting surface for the relief pattern.

The first electrode layer may be electron-injecting and the second electrode layer hole-injecting. Preferably, the first electrode layer is hole injecting and the second electrode layer is electron injecting.

An electron-injecting electrode is suitably made of a metal (alloy) having a low work function, such as Yb, Ca, Mg:Ag Li:Al, Ba or is a laminate of different layers such as Ba/Al or Ba/Ag electrode or other electrode material capable of being pattern-wise deposited using a partitioning relief pattern.

A hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

In a related aspect, the invention relates to an electroluminescent device as mentioned in the opening paragraph which is characterized in that the bend comprises a rounded segment which has, at substantially every position, in a surface substantially parallel to the substrate surface, a radius of curvature of at least 1 μm.

In order to render the bend sufficiently smooth use is made of a rounded segment having a particular minimum curvature. Compared to the extent of undercut this criterion is simpler to use in practice as it only requires the relief pattern to be inspected in plan view, there is no need to take cross-sections.

The radius of curvature $|\rho|$ at a position of the outer boundary, if the outer boundary is situated in a plane, is defined as $|(1+y'^2)^{3/2}/y''|$, where y' and y'' are the first and second derivative at that position of the outer boundary. For non-planar substrate surfaces the definition is modified correspondingly, is defined as $|(1+y'^2)^{3/2}/y''|$, where y' and y'' are the first and second derivative at that position of the outer boundary. For non-planar substrate surfaces the definition is modified correspondingly.

Those skilled in the art will appreciate that the relationship between the extent to which a bent segment is rounded and the risk of short-circuiting is gradual one, and any quantitative dividing line separating rounded from non-rounded bent segments is to some extent arbitrary. Moreover, the minimum radius of curvature represents a compromise between on the one hand the need to reduce the risk of short-circuiting which requires bends to be as smooth as possible and accordingly the radius as large as possible, and on the other hand the need to keep the area occupied by the partitioning relief pattern as small as possible and accordingly the radius of curvature as small as possible, because the area occupied by the relief pattern does not contribute to light emission and its reduces the brightness of the device.

Keeping these considerations in mind, in accordance with the invention, the radius of curvature at a bend is to be at least 1 μm. Preferably, depending on the application of the EL device the radius is at least 2 μm, or at least 5 μm, 10 or even 20 μm. For many applications, such as EL display devices for hand-held, lap top, desk top and TV applications the 5 μm limit is more than adequate. In fact for many such applications average of 10, 15, 20 μm or even larger is suitable. The upper limit to the average radius of curvature is inter alia determined by the minimum feature size of the relief pattern which needs to be rounded off. The minimum feature size in turns determines the resolution of the patterning method used for providing the relief pattern and consequently the range of suitable patterning methods available. In case of photolithography, the resolution provided by proximity printing is adequate for even high-resolution displays. As, generally, the cost of the patterning method goes up as the resolution increases it is favorable to select the radius of curvature as large as possible. Typically, the minimum radius of curvature in case of proximity printing is 5 to 10 μm, using projection lithography 2 to 5 μm and if a stepper is used 1 to 2 μm.

The radius of curvature is to have the specified minimum value at substantially every position along the bend. Because the radius of curvature is a local quantity the rounded segment, indeed any segment of the outer boundary, may contain small pockets of high curvature which do not serve any particular purpose in the device, in particular they do not constitute bends at predetermined positions. Such pockets may occur, for example, as a result of the presence of a dust particle or other systematic or random variations in process conditions. Such pockets are not to be taken into account which is achieved by requiring that the minimum radius condition is to be met at substantially every position. The term substantially is understood to mean in this context that the criterion is to be met by at least 95% or, better, 97% or even better 99% of all positions along the outer boundary.

Instead of rounding a bend, a bend may be beveled.

Therefore, in a further aspect of the invention relates to an electroluminescent device as mentioned in the opening paragraph which is characterized in that the bend is beveled by providing a beveled segment having a length of at least 2 μm and which makes an angle of at least 120° with straight outer boundary segments connected thereto.

With respect to the minimum length of the beveled segment and the minimum angle it makes with adjacent straight line segments the considerations expressed in respect of the rounded segments apply mutatis mutandis. Alternatively, the minimum angle may be chosen for example, 110°, 130° or 140° whereas the minimum length may be 3 μm, 5 μm, 10 μm or even 20 μm if appropriate.

In a preferred embodiment, the overhanging section comprises a photo-patterned or a photo-patternable material such as a photoresist.

The benefits of using sufficiently smoothed bends, beveled and rounded bends alike, are in particular obtained when the overhanging section is manufactured using photo-patternable material, such as conventional photoresist. Use of photo-patternable material allows the overhanging section to be obtained in a simple manner. Examples of such methods are given provided in EP-A-892588.

In a preferred embodiment of the electroluminescent in accordance with the invention the overhanging section is integrally formed from a negative photo-patternable material or material equivalent therewith.

Forming the overhanging section integrally from a negative photo-patternable material such as photoresist allows the overhanging section to be manufactured in a single photolithographic step. The term negative is understood to mean to relate to any photo-patternable material capable of being processed in a manner that, after processing, only the pattern-wise irradiated areas remain on the substrate. Such negative resists are well known in the art and include, in the context of the present invention, image-reversal resists and any other resist processed in a manner such that it behaves as a negative resist.

For example, a convenient method to manufacture overhanging sections in a single photolithographic step, which method is applicable also outside the context of the present invention, to obtain overhanging sections is to illuminate a negative resist in accordance with a pattern having dark non-illuminated regions, fully illuminated regions and, disposed between the dark and fully illuminated regions, intermediately illuminated regions, the intermediately illuminated receiving a radiation dose intermediate to the dose received by the illuminated and non-illuminated regions. When a negative resist is illuminated in accordance with such a pattern, after development, an overhanging section is formed with an undercut region formed in the intermediately illuminated regions. The outer boundary is typically positioned at the boundary of the non-illuminated and intermediately illuminated regions, it being understood that the transition between the intermediate and non-illuminated regions may be a gradual one.

A further embodiment of the electroluminescent device in accordance with the invention is characterized in that the overhanging section comprises a n-way junction, n being at least 3, for partitioning the electrode layer into n mutually separate electrode segments, the outer boundary of the n-way junction comprising a plurality of bends which are sufficiently smooth.

The invention is of particular benefit in relief patterns comprising overhanging sections laid out such as to comprise n-way junctions. Such junctions have at least two inside bends which are close together. The risk of short-circuiting is found to be particularly high in such a configuration. Commonly, the junction is a 3-way junction, such as a T-junction, or a 4-way junction, a crossing.

The invention is applicable to any kind of electroluminescent device, in particular any electroluminescent display device. For example, the device may be a back light, a still image display, illuminated icons, a billboard or a traffic sign. Suitable display devices include matrix displays, multi-color or monochrome, of both the passive and the active type.

In a particular embodiment, the electroluminescent device is a segmented electroluminescent device.

Typically, electrode layers of a segmented display device are patterned to comprise a plurality of independently addressable electrode segments. Typically, but not necessarily, the segments are addressed in a time-multiplexed manner. Typically, at least one of these is provided using a relief pattern having overhanging sections. The desired pattern of the electrode layer is often of a complex shape and comprises many bent outer boundary segments some of which are arranged to form an n-way junctions. The invention is therefore of particular benefit if used in combination with a segmented display device.

In yet another embodiment of the electroluminescent device in accordance with the invention the partitioning relief pattern comprises an overhanging section having at least two protrusions each comprising a plurality of bends each of which are sufficiently smooth to the extent described hereinabove.

In the non-prepublished European patent application, application number 00204053.3, (PH-NL000622) in the name of Applicant it is described that the undercut region of an overhanging section adversely affects the subsequent deposition of fluid layers from which functional layers of the EL device, such as an EL layer, are to be obtained. This is was found to be particularly relevant for a passive matrix device having overhanging sections in the form strips. In order to prevent such adverse effects from occurring the overhanging section are provided with protrusions. However, the requires the outer boundary to be bent at predetermined positions which bends if not sufficiently smooth cause short-circuiting among the electrode segments.

These and other aspects of the invention will be apparent from and elucidated with reference to the embodiments described hereinafter.

In the drawings:

FIG. 1 schematically shows, in a plan view, an electroluminescent device not in accordance with the invention, FIG. 2 schematically shows a cross-section of the device of FIG. 1 along the line I—I, FIGS. 2A, 2B and 2C, show schematically, cross-sections of overhanging sections, FIG. 3 shows, schematically, a plan view of a stage of manufacture of the electroluminescent device shown in FIG. 1, FIG. 4 shows, schematically, a cross-section of the device of FIG. 1 along the line II—II at the stage of manufacture shown in FIG. 3, FIG. 5 shows, schematically, a plan view of an electroluminescent device in accordance with the invention, FIG. 6 shows an enlarged view of a section of the plan view of FIG. 5, and FIG. 7 shows a plan view of a further embodiment of a partitioning relief pattern for use in an EL device in accordance with the invention,

EMBODIMENT 1 (NOT IN ACCORDANCE WITH THE INVENTION)

Referring to FIGS. 1 and 2, the EL device 1 has a substrate 3 onto which is provided, in succession, a first electrode layer comprising independently addressable electrodes 5a and 5b for injecting charges of a first type (holes or electrons), a charge injecting/transport layer 7 for injecting and/or transporting charges of the first type, an electroluminescent layer 9, and a second electrode layer comprising independently addressable electrodes 11a, 11b and 11d for injecting charges of a second type. When a voltage is applied to the electrodes, holes and electrons are injected. By recombination of the injected holes and electrons in the electroluminescent 9 light of a particular color is produced.

In order to partition the second electrode layer the EL device 1 comprises a partitioning relief pattern of which an overhanging section 13 is shown. The overhanging section 13 has undercut regions 15. The extent of undercut is indicated by the distance U.

FIGS. 2A, 2B and 2C show further embodiments 213 of overhanging sections. In FIGS. 2A and 2C, the overhanging section 213 is supported by pedestal section 214 which in FIG. 2C is an integral part of the partitioning relief pattern.

The overhanging section 13 has an outer boundary 13a which comprises straight segments bent at predetermined positions to form bends 13b–e. The bend 13b is an outside bend as segments connecting points on the one side of the bend with points on the other side thereof traverse the relief pattern 13. Analogously, the bends 13c–e are inside bends as the segments run outside the relief pattern 13. The bends 13d and 13e are part of a 3-way T-shaped junction for partitioning the electrode layer into the 3 mutually separate electrode segments 11a, 11b and 11d.

Because of the undercut regions 15, the overhanging section 13, during manufacture (a detailed example is described hereinbelow), allows patterning of the second electrode layer into the different segments 11a, 11b, 11c and 11d resulting in independently addressable electrodes 11a, 11b and 11d and a segment 11c of non-functional electrode material. However, because the bends 13-b–e are not sufficiently smooth, there is a high risk that the desired separation of the electrode segments does not take place. This is shown in FIG. 1 to be the case for the bends 13b, 13d and 13e. At bends 13b and 13d the electrode segments 11a and 11c are connected, whereas at bend 13d the segments 11c and 11d are connected which results in a conducting path being formed connecting the electrode segments 11a and 11d and consequently a short-circuited second electrode layer. Short circuits need be formed between adjacent segments as is shown here but an electrode segment may short-circuit with any segment to which it is connectable via the non-functional segment 11c. In practical designs, any two segment which are meant to be independently addressable are connectable via a non-functional segment present on top of the relief pattern.

FIGS. 3 and 4 show, schematically, a stage in the manufacture of an electroluminescent device which serves to illustrate the origin of the problem of short-circuited electrodes. In particular, a stage in the manufacture of the EL device 1 is shown. The stage shown is the illumination of a layer 12 of photo-patternable material from which the overhanging section 13 (the outline of which is shown in dashed lines) is obtainable. In the present example, the photo-patternable material is a negative photoresist. By patternwise exposing, in proximity, the layer 12 through a mask 17 having openings 17b, fully illuinínated areas 12c and non-illuminated areas 12a are formed. Due to diffraction effects occurring at the mask edges 17a, intermediately illuminated areas 12b are also formed where it is understood that the transition between the different area is not abrupt but gradual. Since the negative photoresist used has the property that non-illuminated areas 12a remain soluble and fully illuminate areas 12c are rendered insoluble, the intermediately illuminated areas 12b have intermediate solubility thus producing, after development, undercut regions 15 in the overhanging section 13. By varying the parameters of the patterning process, in particular by varying the distance of the mask 17 to the layer 12, any suitable amount of undercut can be achieved.

Referring to FIG. 3, the mask 17 defines the outline of the overhanging section 13. The intermediately illuminated areas 12b are situated between the mask edges 17a and outer boundary 13a. The illumination pattern shown in FIG. 4 is typical for positions remote from bends. However, at the bends 13b–e (see FIG. 2) the illumination pattern appears to be different. At least one difference is that at outside bends, such as the bend 13b, intermediately illuminated regions such as the region 14b receive less light, ie are underexposed with respect to the region remote from the bend. At inside bends, such as the bends 13c–e, intermediately illuminated regions 14c–e receive more light than the intermediately illuminated regions of straight segments such as the region 12b. Moreover, in case the substrate surface reflects light interference patterns in the regions 14b–e are in general different from those set up at in the regions 12b. As a result of the differences in illumination between the regions 14b and the regions 12b, the extent of undercut at the straight line segments of the overhanging section 13 substantially differs from that of the bend positions 13b–e.

The reduced extent of undercut at the bends increases the risk that the electrode layer will not be partitioned as required, resulting for example in the device shown in FIG. 1.

The risk of electrode segments being inadvertently connected is particularly high where the overhanging section 13 comprises an n-way junction such as the 3-way T-junction shown in FIGS. 1 and 3.

By way of example, the EL device 1 is manufactured as follows:

A transparent-lime glass substrate 3 is, in a conventional manner, provided with a patterned first electrode layer having segments 5a, 5b of ITO.

Then, after cleaning and priming the ITO-coated substrate, image reversal resist AZ5214E (supplier Hoechst) is spun on the substrate to yield a 5 μm thick resist layer 12. The resist layer 12 is subjected to a first pattern-wise exposure by means of radiation 417 through a mask 17 having an opening 17b which is 20 μm wide. The exposure is performed in proximity with a mask to substrate distance of 50 μm and a dose of 35 mJ/cm² is delivered to the resist layer 12 in the fully illuminated regions 12c. Due to diffraction at the mask edges 17a, intermediately exposed regions 12b are provided. The resist layer 12 is then baked on a hot plate for 10 min at 110° to reverse the latent image, flood exposed with a dose 420 mJ/cm² and developed for 90 s in 1:1 AZ developer water mixture by immersion in a developer bath. After development, the partitioning relief pattern is obtained which has an overhanging section 13 in the form of an inverted trapezoid which measures 24 μm at the top and about 20 μm at the base, resulting in an undercut section 15 having an extent of undercut U of about 4 μm and an angle of undercut of about 45°.

A charge transport layer 7 is deposited by spin-coating an aqueous solution of poly-3,4-ethylenedioxythiophene, PEDOT, (Baytron P, supplier Bayer AG), and drying the wet PEDOT layer to yield layer 7 of 150 nm thickness.

Subsequently, a 0.6% by weight solution of the polymer of formula (1) wherein—

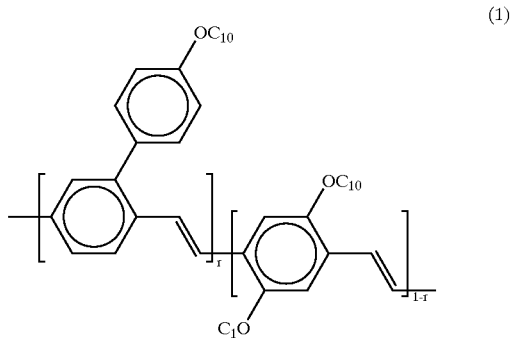

(1)

$OC_{10}$ designates 3,7-dimethyloctyloxy, r and 1–r equal 0.5 and indicate the proportion of units having the structure indicated in brackets, to which, respectively, r and 1–r is suffixed in toluene is spin-coated at 1250 rpm which results in a wet layer of average thickness 11.6 μm.

The copolymer is synthesized according to a similar method in WO 99/21936. After drying the wet layer, a plurality of organic EL layer 9 of NRS-PPV having an average thickness of 70 nm is obtained.

While using the relief pattern the overhanging section 13 as a built-in shadow mask, 3 nm thick Ba and 200 nm thick Al layers are successively deposited on top of the EL layer 9 by means of vacuum deposition of metal vapor thus forming a partitioned second electrode layer comprising electrode segments 11a–d of which segments 11a, 11b, and 11d from independently addressable cathodes and segment 11c is non-functional electrode material.

When the method is repeated a number of times it is found that in many cases the resulting device is defective because the electrode segments which ought to be independently addressable are in fact electrically connected. The yield depends on the desired pattern of the second electrode layer in particular on the number of bends it contains.

Embodiment 2 (in Accordance with the Invention)

The EL device 51 is identical to the EL device 1, in particular the cross-section shown in FIG. 2 taken along a line corresponding to the line I—I of FIG. 1, except that the bends 13b–e of the outer boundary 13a of the overhanging section 13 are, in accordance with the invention, sufficiently smooth.

For the purpose of illustrating the invention the relief pattern comprises various possibilities of sufficiently smooth bends. In practice one would preferably use one and the same type throughout.

Figure 5:
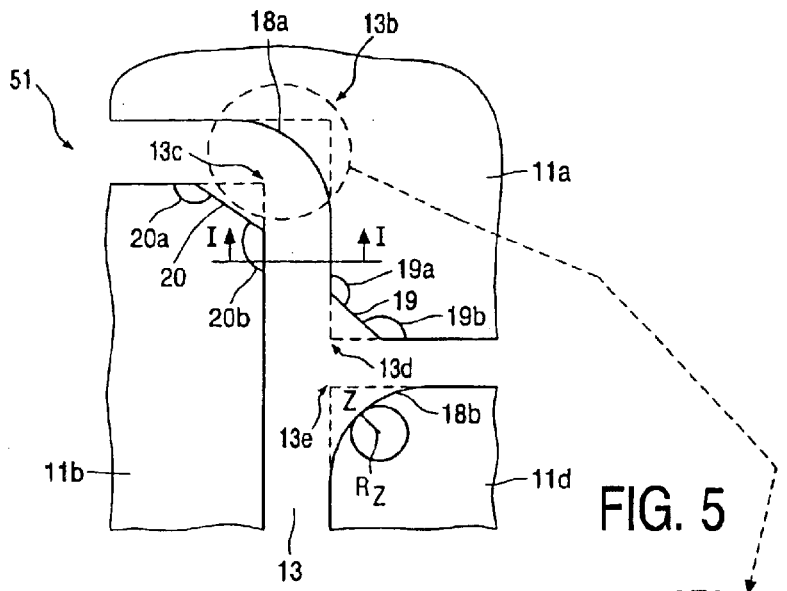
FIG. 5 shows, schematically, a plan view of an electroluminescent device in accordance with the invention.
Figure 6:
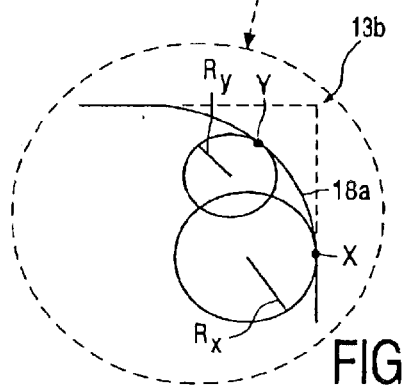
FIG. 6 shows an enlarged view of a section of the plan view of FIG. 5.

Outside bend 13b of which an enlarged view is shown in FIG. 6, and inside bend 13e, are rendered sufficiently smooth by rounded segments 18a and 18b respectively. The extent of rounding is quantified by the radius of curvature at positions along the rounded segments 18a, 18b, the radius being considered in a surface parallel to the substrate surface. In the present embodiment the substrate surface is a planar surface parallel to the plane of drawing of FIG. 5.

The circles drawn in FIG. 6 touch the rounded segment 18a at positions X and Y and the circle in FIG. 5 touches the rounded segment 18b at position Z. The circles have, at positions X and Y, the same tangent and curvature as the rounded segment 18a and are characterized by radii of curvature $R_x$ and $R_y$ respectively. Likewise, the radius of curvature at Z is $R_z$. The radius of curvature at substantially each position of the rounded segment 18a and 18b is to exceed a specific minimum radius of curvature, in order to the reduce the risk of electrode segments being inadvertently connected.

A significant reduction in said risk is achieved by setting the minimum radius of curvature to 1 μm. The risk is further reduced by setting the value to 2 μm, 5 μm or 10 μm respectively. For many applications, a minimum of 15 μm or more can be suitably used. In particular the rounded segments 18a and 18b can be circular segments and thus segments of constant curvature.

Inside bends 13c and 13d are beveled using a straight line segment 20, which makes angles 20a and 20b with adjacent straight line segments, and straight line segment 19, which makes angles 19a and 19b with adjacent straight line segments, respectively. The length of the segments 20 and 19 and the angles which these segments make which adjacent straight line segments are to have a specified minimum length and minimum angle respectively in order to reduce the risk of electrode segments of the second electrode layer being inadvertently connected.

A convenient design rule is that the length of the segments 17 is to be at least 2 μm and the at the angles at least 120°. Alternatively, the minimum angle may be chosen for example, 110°, 130° or 140° whereas the minimum length may be 3 μm, 5 μm, 10 μm or even 20 μm if appropriate.

If a large number of EL devices 51 having the sufficiently smooth bends are manufactured in accordance with the method described in embodiment 1 the yield of the manufacturing process dramatically increases. Depending on the desired pattern of the second relief pattern manufacturing yields may typically increase by a factor of 4 or more.

Figure 7:
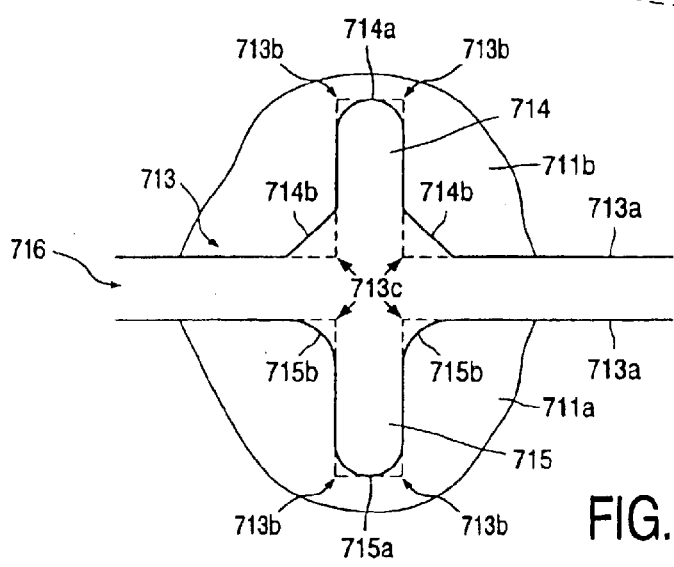

FIG. 7 shows a plan view of a further embodiment of a partitioning relief pattern for use in an EL device in accordance with the invention. The relief pattern is of particular use in a passive matrix electroluminescent display device. The relief pattern comprises overhanging sections 713 which allow separated electrode segments to be deposited in the areas 711a and 711b. The overhanging section 713 has an outer boundary 713a which is bent at predetermined positions 713b and 713c to form an elongate straight line section 716 carrying protrusions 714 and 715 extending at right angles therefrom. The outside bends 713b are rendered sufficiently smooth using rounded segments 714a and 715a whereas the inside bends 713c are smoothed using rounded segments 715b or beveled using straight segments 714b. Without the outer boundary 713a being smoothed at the bends (indicated by the dashed lines) the undercut at the bends is insufficient increasing the risk of electrode segments 711a and 711b being inadvertently connected via, for example, a bend 713c on the side of the area 711a, non-functional electrode material deposited on top of the elongate section 716 and a bend other side such as 713c.

What is claimed is:

1. An electroluminescent device comprising
a substrate surface provided with a partitioning relief pattern comprising
an overhanging section which is undercut for patterning an electrode layer of the electroluminescent device,
the overhanging section having an outer boundary comprising at least a straight segment and a bend at a predetermined position,
wherein:
the overhanging section comprises a single layer of material to which the undercut is applied to form an overhanging structure from the material, and is integrally formed from a negative photo-patternable material, and
the bend is sufficiently smooth to render the overhanging section at a bend undercut to substantially a same extent as at the straight segment of the overhanging section.

2. An electroluminescent device as claimed in claim 1, wherein
the overhanging section comprises a photo-patterned material.

3. An electroluminescent device as claimed in claim 1 characterized in that
the overhanging section comprises a n-way junction, n being at least 3, for partitioning the electrode layer into n mutually separate electrode segments,
the outer boundary of the n-way junction comprising a plurality of ends which are sufficiently smooth.

4. An electroluminescent device as claimed in claim 3 wherein
the electroluminescent device is a segmented electroluminescent device.

5. An electroluminescent device as claimed in claim 1, wherein
the overhanging section includes at least two protrusions, each protrusion comprising a plurality of bends.

6. An electroluminescent device comprising
a substrate surface provided with a partitioning relief pattern comprising
an overhanging section which is undercut for patterning an electrode layer of the electroluminescent device,
the overhanging section having an outer boundary comprising at least a straight segment and a bend at a predetermined position,
wherein:
the overhanging section comprises a single layer of material to which the undercut is applied to form an overhanging structure from the material, and is integrally formed from a negative photo-patternable material, and
the bend comprises a rounded segment which has, at substantially every position, in a surface substantially parallel to the substrate surface, a radius of curvature of at least 1 μm.

7. An electroluminescent device as claimed in claim 6, wherein
the overhanging section comprises a n-way junction, n being at least 3, for partitioning the electrode layer into n mutually separate electrode segments, and
the outer boundary of the n-way junction comprising rounded bends, each with a radius of curvature of at least 1 μm.

8. An electroluminescent device as claimed in claim 6, wherein
the overhanging section includes at least two protrusions, each protrusion comprising a plurality of rounded bends, each with a radius of curvature of at least 1 μm.

9. An electroluminescent device comprising
a substrate surface provided with a partitioning relief pattern comprising
an overhanging section which is undercut for patterning an electrode layer of the electroluminescent device,
the overhanging section having an outer boundary comprising at least a straight segment and a bend at a predetermined position, wherein:

the overhanging section comprises a single layer of material to which the undercut is applied to form an overhanging structure from the material, and is integrally formed from a negative photo-patternable material, and the bend is beveled by providing a beveled segment having a length of at least 2 μm and which makes an angle of at least 120° with straight outer boundary segments connected thereto.

10. An electroluminescent device as claimed in claim 9, wherein the overhanging section comprises a n-way junction, n being at least 3, for partitioning the electrode layer into n mutually separate electrode segments, and the outer boundary of the n-way junction comprising beveled bend segments of at least 2 μm in length that form an angle of at least 120° with straight outer boundary segments connected thereto.

11. An electroluminescent device as claimed in claim 9, wherein the overhanging section includes at least two protrusions, each protrusion comprising a plurality of beveled bend segments of at least 2 μm in length that form an angle of at least 120° with straight outer boundary segments connected thereto.

* * * * *